United States Patent
Krymski

(10) Patent No.: US 9,363,456 B2
(45) Date of Patent: *Jun. 7, 2016

(54) IMAGE SENSORS AND METHODS WITH MULTIPLE COLUMN READOUT LINES FOR A COLUMN OF PIXELS MULTIPLEXED TOGETHER FOR OUTPUT

(71) Applicant: Luxima Technology LLC, Pasadena, CA (US)

(72) Inventor: Alexander Krymski, Sunny Isles Beach, FL (US)

(73) Assignee: Luxima Technology LLC, Pasadena, CA (US)

( * ) Notice: Subject to any disclaimer, the term of this patent is extended or adjusted under 35 U.S.C. 154(b) by 34 days.

This patent is subject to a terminal disclaimer.

(21) Appl. No.: 14/302,172

(22) Filed: Jun. 11, 2014

(65) Prior Publication Data

US 2014/0284454 A1    Sep. 25, 2014

Related U.S. Application Data

(62) Division of application No. 13/343,662, filed on Jan. 4, 2012, now Pat. No. 8,785,831.

(60) Provisional application No. 61/430,121, filed on Jan. 5, 2011.

(51) Int. Cl.
*H04N 5/378* (2011.01)
*H01L 27/146* (2006.01)
(Continued)

(52) U.S. Cl.
CPC ............ *H04N 5/378* (2013.01); *H01L 27/1461* (2013.01); *H01L 27/14607* (2013.01); *H04N 5/3742* (2013.01); *H04N 5/3745* (2013.01); *H04N 5/37452* (2013.01)

(58) Field of Classification Search
CPC ...... H04N 5/378; H04N 5/3742; H04N 3/155
USPC ....... 250/208.1, 214 R, 214 A; 348/292–311; 257/290–292, 440–444
See application file for complete search history.

(56) References Cited

U.S. PATENT DOCUMENTS 6,512,546 B1 * 1/2003 Decker .................. H04N 5/378
                                                                348/280
6,750,485 B2   6/2004 Berezin et al.
(Continued)

OTHER PUBLICATIONS

Notice of Allowance for U.S. Appl. No. 13/343,662, mailed Mar. 17, 2014.

(Continued)

*Primary Examiner* — Que T Le
(74) *Attorney, Agent, or Firm* — Foley & Lardner LLP

(57) ABSTRACT

An image sensor includes a plurality of pixels and a row driver. Each pixel includes a photodiode, a first transfer gate, a second transfer gate, a first storage node, and a second storage node. The row driver is configured to provide signals to the first transfer gate and the second transfer gate of each pixel such that charge is transferred from the photodiode to the first storage node through the first transfer gate while a signal representing charge stored at the second storage node is output from the pixel to a column readout line. The row driver is also configured to provide signals to the first transfer gate and the second transfer gate such that charge is transferred from the photodiode to the second storage node through the second transfer gate while a signal representing charge stored at the first storage node is output from the pixel.

20 Claims, 13 Drawing Sheets

(51) Int. Cl.
 *H04N 5/374* (2011.01)
 *H04N 5/3745* (2011.01)

(56) References Cited

U.S. PATENT DOCUMENTS

| | | | |
|---|---|---|---|
| 6,953,923 B2 * | 10/2005 | Yang | H04N 3/155 250/208.1 |
| 7,205,522 B2 | 4/2007 | Krymski | |
| 7,286,174 B1 | 10/2007 | Weale et al. | |
| 7,336,214 B2 | 2/2008 | Krymski | |
| 7,400,279 B2 | 7/2008 | Krymski | |
| 7,436,496 B2 | 10/2008 | Kawahito | |
| 7,488,928 B2 | 2/2009 | Krymski | |
| 7,659,925 B2 | 2/2010 | Krymski | |
| 7,804,438 B2 | 9/2010 | Krymski | |
| 7,876,362 B2 | 1/2011 | Krymski | |
| 8,174,603 B2 | 5/2012 | Krymski | |
| 8,310,578 B2 | 11/2012 | Krymski | |
| 8,698,061 B2 | 4/2014 | Krymski | |
| 8,723,093 B2 | 5/2014 | Krymski | |
| 8,785,831 B2 | 7/2014 | Krymski | |
| 2009/0273694 A1 | 11/2009 | Krymski | |
| 2009/0273696 A1 | 11/2009 | Krymski | |
| 2011/0139963 A1 | 6/2011 | Krymski | |
| 2013/0027594 A1 | 1/2013 | Krymski | |

OTHER PUBLICATIONS

Magnan, et al, "3D Time-Of-Flight Image Capture with Pulsed Illumination", Proc. of IEEE Int. Solid-State Circuits Conf. (ISSCC) 2011, Forum F5, San Francisco, Feb. 24, 2011, Slides 1, 2, 33, 34, 37, 38, 39 and 40.

Tubert, et al, "High Speed Dual Port Pinned-photodiode for Time-Of-Flight Imaging", in Proc. of 2009 Int. Image Sensor Workshop (IISW), Bergen, Norway, 2009.

* cited by examiner

IMAGE SENSORS AND METHODS WITH MULTIPLE COLUMN READOUT LINES FOR A COLUMN OF PIXELS MULTIPLEXED TOGETHER FOR OUTPUT

CROSS-REFERENCE TO RELATED PATENT APPLICATIONS

This application is a divisional application of U.S. patent application Ser. No. 13/343,662, filed Jan. 4, 2012, which claims priority from U.S. Provisional App. Ser. No. 61/430,121, filed Jan. 5, 2011, the entire contents of both of which are incorporated by reference herein.

BACKGROUND OF THE INVENTION

1. Field of the Invention

Embodiments of the present invention relate generally to image sensors, pixels, and methods and, in specific embodiments, to image sensors with global shutter pixels.

2. Related Art

Image sensors have found wide application in consumer and industrial electronics, and have enabled an explosion in a number of digital cameras and digital video devices used for work and entertainment.

FIG. 1 illustrates an architecture of a related art image sensor 1. The image sensor 1 includes a pixel array 2, a row driver 4, column readout circuitry 7, and a column circuit timing controller 9. The pixel array 2 includes pixels 3 that are arranged in rows and columns. Each pixel 3 includes a light sensitive element, such as a photodiode, or the like, to sample light intensity of a corresponding portion of a scene being imaged, and each pixel 3 is configured to produce an analog pixel signal based on the sampled light intensity. The row driver 4 supplies control signals to the pixels 3 in the pixel array 2 to control an operation of the pixels 3.

Pixels 3 that are in a same row of the pixel array 2 share common row control signals from the row driver 4. For example, pixels 3 in a first row of the pixel array 2 share common row control lines $5_1$ for receiving control signals from the row driver 4. Similarly, pixels 3 in a second row of the pixel array 2 share common row control lines $5_2$ for receiving control signals from the row driver 4, and pixels 3 in an $n^{th}$ row of the pixel array 2 share common row control lines $5_n$ for receiving control signals from the row driver 4. Pixels 3 that are in a same column of the pixel array 2 share a common column readout line to provide output. For example, pixels 3 in a first column of the pixel array 2 share a column readout line $6_1$, pixels 3 in a second column of the pixel array 2 share a column readout line $6_2$, and pixels 3 in an $m^{th}$ column of the pixel array 2 share a column readout line $6_m$. The row driver 4 controls the pixels 3 to provide output row by row.

FIG. 2 illustrates an example of a conventional pixel 3. The pixel 3 illustrated in FIG. 2 is provided as an example of a pixel in a $k^{th}$ column of a pixel array, such as the pixel array 2 (refer to FIG. 1). The pixel 3 includes a substrate 20, a photodiode (PD) 21, a transfer gate 22, a storage diffusion 23, an anti-blooming gate 24, an anti-blooming gate diffusion 25, a reset transistor 26, a source follower transistor (SF) 27, and a row select transistor 28. The storage diffusion 23 may also be called a floating diffusion (FD) node 23 or a readout node 23. The anti-blooming gate 24 may also be called a shutter gate 24. The photodiode 21 may be, for example, a pinned photodiode that collects charge during exposure based on the light intensity of a corresponding portion of a scene being imaged.

The transfer gate 22 is connected to receive a transfer control signal (TX), and the transfer gate 22 is controllable by the transfer control signal TX to transfer charge from the photodiode 21 to the storage diffusion 23. The anti-blooming gate 24 is connected to receive an anti-blooming control signal (AB), and the anti-blooming gate 24 is controllable by the anti-blooming control signal AB to allow for charge to be drained from the photodiode 21 to the anti-blooming gate diffusion 25. The anti-blooming gate diffusion 25 is connected to a reset voltage source (not shown) that supplies a reset voltage (Vrst).

A first terminal of the reset transistor 26 is connected to the reset voltage source that provides the reset voltage (Vrst). A gate of the reset transistor 26 is connected to receive a reset control signal (RST). A second terminal of the reset transistor 26 is connected to the storage diffusion 23 and to a gate of the source follower transistor 27. The gate of the source follower transistor 27 is connected to the storage diffusion 23 and to the second terminal of the reset transistor 26. A first terminal of the source follower transistor 27 is connected to a voltage source (not shown) that supplies a voltage (Vdd).

A second terminal of the source follower transistor 27 is connected to a first terminal of the row select transistor 28. A gate of the row select transistor 28 is connected to receive a row select control signal (ROW). A second terminal of the row select transistor 28 is connected to a column readout line $6_k$ for providing a pixel output signal (pout) for the pixel 3 on the column readout line $6_k$. Thus, the pixel 3 is controlled with the four control signals AB, TX, RST, and ROW, and the pixel 3 provides an output signal (pout).

If space allows, the anti-blooming gate diffusion 25 and a source terminal of the reset transistor 26 receive power from the reset voltage source (not shown) supplying the reset voltage Vrst, which can be run either horizontally, or vertically, or as a mesh in a pixel array. The source follower transistor 27 is powered from the voltage source (not shown) supplying Vdd, which is run as a vertical wire in each column of a pixel array. If space is tight, Vrst can be combined with Vdd.

FIG. 3 illustrates a circuit diagram representation of the pixel 3 of FIG. 2. In FIG. 3, the transfer gate 22 and the anti-blooming gate 24 are represented as gates of transistors, with a first terminal of each of those transistors connected to the photodiode 21. Those two transistors plus the reset transistor 26, the source follower transistor 27, and the row select transistor 28 equal five transistors, so the pixel 3 is conventionally referred to as a five transistor (5T) pixel. The floating diffusion node 23 is connected to the gate of the source follower transistor 27. The anti-blooming gate diffusion 25 is connected to a voltage source (not shown). The pixel 3 is connected to provide output on the column readout line $6_k$.

An operation of the pixel 3 is now described with reference to FIGS. 2 and 3. When the anti-blooming control signal AB applied to the anti-blooming gate 24 is HIGH, all charges from the photodiode 21 are drained out into Vrst or Vdd (whatever is connected to the anti-blooming gate diffusion 25). When an image capture operation is initiated for the pixel 3, the anti-blooming control signal AB and the transfer control signal TX are controlled to be LOW, so that charge is collected during exposure in the photodiode 21. Prior to transferring the charge, the floating diffusion node 23 is cleared either with a reset pulse by controlling the reset control signal RST to be HIGH and then LOW, or the floating diffusion node 23 remained empty from a previous readout from the floating diffusion node 23.

The transfer of charge from the photodiode 21 to the floating diffusion node 23 is then performed by controlling the transfer control signal TX applied to the transfer gate 22 to be HIGH. After the transfer is done, the transfer control signal TX is controlled to be LOW, and a new exposure in the photodiode 21 can start, controlled by the anti-blooming control signal AB. The anti-blooming control signal AB can be controlled to be HIGH to cause charge to be drained from the photodiode 21, and then exposure starts with bringing the anti-blooming control signal AB to LOW. The readout of charge from the pixel 3 is done in parallel with an exposure that collects charge for a subsequent readout.

The readout from the pixel 3 can start right after the transfer of the charge from the photodiode 21 to the floating diffusion node 23. The readout is performed row by row in the pixel array 2 (refer to FIG. 1). To perform the readout from the pixel 3, the row select control signal ROW is controlled to be HIGH, and a pixel signal corresponding to a charge at the floating diffusion node 23 is read out over the column readout line $6_k$. The row select control signal ROW is then controlled to be LOW, and the reset control signal RST is controlled to be HIGH to empty the floating diffusion node 23. The reset control signal RST is then controlled to be LOW and the row select control signal ROW is controlled to be HIGH to read out a potential (the reset value) of the empty floating diffusion node 23 over the column readout line $6_k$.

The pixel signal corresponding to the charge at the floating diffusion node 23 prior to reset and the reset value corresponding to the reset potential at the floating diffusion node 23 after reset are provided to a corresponding column readout circuit 8 (refer to FIG. 1) for the column in which the pixel 3 is located. The column readout circuit 8 digitizes a difference between the pixel signal and the signal of the reset potential to provide a digital output representing the charge collected by the pixel 3 during the corresponding exposure.

With reference again to FIG. 1, the column readout circuitry 7 includes a column readout circuit 8 for each column of pixels 3 in the pixel array 2. Each column readout circuit 8 is connected to receive analog signals from a corresponding column readout line, and is configured to provide digital output on a corresponding output line. For example, the column readout circuit 8 for the first column is connected to the column readout line $6_1$ for receiving input, and is connected to an output line $11_1$ for providing output. Similarly, the column readout circuit 8 for the second column is connected to the column readout line $6_2$ for receiving input, and is connected to an output line $11_2$ for providing output, and the column readout circuit 8 for the $m^{th}$ column is connected to the column readout line $6_m$ for receiving input, and is connected to an output line $11_m$ for providing output. The column circuit timing controller 9 is configured to provide control signals to the plurality of column readout circuits 8 over one or more control lines 10.

There are various types of shutter operations. One example type of shutter operation is a global shutter operation. Pixels that can be used for global shutter operations are called global shutter pixels. An example of a global shutter pixel is the 5T pixel illustrated in FIG. 3. In a global shutter operation, the transfer of charge from the photodiode of each pixel to the pixel storage of each pixel is done simultaneously for all pixels in the pixel array, so the exposure ends at a same time for all the pixels. The beginning of the exposure in the global shutter operation can be controlled, for example, by using a shutter or anti-blooming gate.

The 5T global shutter pixel is extensively used in high speed imaging. The 5T pixel allows for simultaneous acquisition of an image in all pixels of an image sensor and it allows for exposure control independent of the readout. As explained above, the photodiode in a 5T pixel is controlled with two gates. One of the gates is the transfer gate to transfer and store the useful signal charge, and the other gate is the shutter gate or anti-blooming gate which serves for exposure control and for spilling an excessive photodiode charge (antiblooming protection). In a preferred case of the photodiode being a pinned photodiode, either of the gates is able to completely empty the photodiode. FIG. 4 illustrates a typical topology of the placement of the transfer (TX) gate and the anti-blooming (AB) gate with respect to the photodiode (PD).

The 5T pixel has a number of known performance issues, such as issues related to large pixel size and to very high speed imaging. When the frame rate goes up, and the exposure becomes shorter and shorter (e.g. there are applications requiring 1 million frames per second with a frame read time of 1 µs), less and less photons strike the pixel for the exposure time. One natural solution to very high speed imaging is to use a larger pixel which can collect more photons from the light of the same intensity.

However, there is a collection time limitation inherent to the detector itself. For an ideal case of a flat pinned photodiode, the charge in the channel of the pinned diode is cleared through a diffusion process. If the typical size of the photodiode is L (say, this is the longest path in the pixel for carriers to travel to the respective TX or AB gate, then the typical travel time constant is $L^2/D$, where D is the diffusion coefficient.

For a typical pixel size of 10 µm, and a diffusion coefficient of 10 cm$^2$/s, the characteristic transfer time in the channel of the photodiode is $10^{-7}$ s, which is 100 ns. It takes up to 5 time constants to fully transfer the charge. Also, the potential in the pinned photodiode channel may have a "bowl" shape slowing down the transfer. Thus, the response time of the conventional pinned photodiode of a 10 µm size is limited to approximately within a range of 500 ns to 1 µs. If the photodiode size grows to 20 µm to 30 µm to address the photon limitation issue, the pixel transfer time slows down by another factor of 4 to 9, which means the topology of the photodiode and the gates in FIG. 4 cannot be used for lag-less operation of the 20 µm to 30 µm size pixels operating with exposure time of 1 µs.

Similar problems exist with pinned photodiode pixels used for phase detection. In a lock in photodiode detector of a 10 µm size with a flat potential pinned channel, and which has 2 gates, a period of efficient de-modulation of light is limited to 500 ns, so the efficiency of modulation starts falling down at a frequency of 1 MHz and above.

A pinned photodiode pixel is described by Berezin et al. in U.S. Pat. No. 6,750,485, entitled "Lock-In Pinned Photodiode Photodetector," issued Jun. 15, 2004, the entire contents of which are incorporated by reference herein, and which is herein referred to as "Berezin." Berezin describes a pinned photodiode pixel with 4 transfer gates. A high frequency 4-phase clock goes around and sends photocharge from the photodiode into 4 respective outputs for accumulation. This process is repeated 100-1000 or more times, but each output storage keeps the phase of the charges collected during the respective phase. With two outputs, one output collects signal chopped during [0°-180°] then [360°-540°], while the other output collects the signals coming to the pixel during phases [180°-360°], [540°-720°], and so on.

That is the principle of in-pixel phase detection. It allows to use modulated light (~10-100 MHz) and measure a distance from the sensor to an object based on Time-of-Flight (TOF). A similar pixel to the pixel described in Brezin is described by Kawahito in U.S. Pat. No. 7,436,496, entitled "Distance Image Sensor," issued Oct. 14, 2008, the entire contents of which are incorporated by reference herein, and which is herein referred to as "Kawahito."

Another problem with very high speed imaging is that a ratio of the transfer time to the total frame time becomes too large. In the example of a 10 μm pixel above, one needs to allocate at least 500 ns to the transfer through TX gate to avoid image lag. This means that, if the sensor operates at 1 million frames/s, 500 ns is spent for the transfer, and there is only 500 ns left to read out the frame of the shuttered image. FIG. 5 illustrates a frame timing of a conventional 5T pixel. The readout from the pixel array cannot be done during the transfer time, which is Vertical Blank (VB). The TX transfer time takes a noticeable portion of the entire frame time, so that less time is left for pixel readout.

SUMMARY OF THE DISCLOSURE

An image sensor in accordance with an embodiment includes a pixel and a row driver. The pixel includes a photodiode, a first transfer gate, a second transfer gate, a first storage node, and a second storage node. The row driver is configured to provide signals to the first transfer gate and the second transfer gate such that charge is transferred from the photodiode to the first storage node through the first transfer gate while a signal representing charge stored at the second storage node is output from the pixel to a column readout line.

In various embodiments, the row driver is configured to provide signals to the first transfer gate and the second transfer gate such that charge is transferred from the photodiode to the second storage node through the second transfer gate while a signal representing charge stored at the first storage node is output from the pixel to the column readout line.

In some embodiments, the row driver is configured to provide signals to the first transfer gate and the second transfer gate such that charge is transferred from the photodiode to the second storage node through the second transfer gate while a signal representing charge stored at the first storage node is output from the pixel to a second column readout line that is separate from the column readout line.

In various embodiments, the image sensor further comprises a first readout circuit connected to the first storage node and a second readout circuit connected to the second storage node. In some embodiments, the first transfer gate and the second transfer gate are located on a same side of the photodiode. In various embodiments, the photodiode has a gradient of electric field, and a negative gradient of the electric field in the photodiode is directed toward the first transfer gate and the second transfer gate.

In some embodiments, the row driver controls the first transfer gate to be open when the second transfer gate is closed and controls the second transfer gate to be open when the first transfer gate is closed. In various embodiments, the photodiode has at least two areas with a difference in pinning voltage between the at least two areas of at least 250 mV. In various embodiments, the photodiode has a greater dose of buried n-implant in an area closer to the first transfer gate than in an area farther away from the first transfer gate. In various embodiments, the photodiode has triangular areas in which a potential in the triangular areas is approximately zero. In some embodiments, an implant of the photodiode is in the shape of rays proceeding from the first transfer gate and the second transfer gate.

A method of making a pixel in accordance with an embodiment includes providing a first dose of a buried n-implant to cover an entire area of a photodiode, and providing a second dose of the buried n-implant that overlaps only a portion of the first dose. In some embodiments, the method further includes providing a third dose of the buried n-implant that overlaps only a portion of the second dose. In some embodiments, the third dose is applied closer to a first transfer gate and a second transfer gate than an area of the second dose that is without the third dose is to the first transfer gate and the second transfer gate. Also, in some embodiments, the second dose is applied using a mask to be patterned in the shape of rays extending from a first transfer gate and a second transfer gate.

A method of operating an image sensor in accordance with an embodiment includes providing signals to a first transfer gate and a second transfer gate such that charge is transferred from a photodiode to a first storage node through the first transfer gate while a signal representing charge stored at a second storage node is output to a column readout line, and providing signals to the first transfer gate and the second transfer gate such that charge is transferred from the photodiode to the second storage node through the second transfer gate while a signal representing charge stored at the first storage node is output.

In some embodiments, the first transfer gate is controlled to be open when the second transfer gate is closed and the second transfer gate is controlled to be open when the first transfer gate is closed. In some embodiments, the signal representing charge stored at the first storage node is output to the column readout line. In various embodiments, the signal representing charge stored at the first storage node is output to a second column readout line that is separate from the column readout line.

An image sensor in accordance with an embodiment includes a pixel array comprising a plurality of rows and a plurality of columns of pixels, and a plurality of column readout lines for a column of the pixel array, where the plurality of column readout lines are multiplexed together to have a single sensor output per column.

In some embodiments, the pixel array is divided in half such that pixels in a top half of the pixel array output signals to a top side of the pixel array and pixels in a bottom half of the pixel array output signals to a bottom side of the pixel array. In some embodiments, the plurality of column readout lines are connected to pixels in a top half of the column and another plurality of column readout lines are connected to pixels in a bottom half of the column. Also, in some embodiments, the plurality of column readout lines that are connected to the pixels in the bottom half of the column are multiplexed together to have a single sensor output.

An image sensor in accordance with an embodiment includes a pixel array that is split in half In various embodiments, a plurality of analog outputs are output per column of the pixel array.

DETAILED DESCRIPTION OF PREFERRED EMBODIMENTS

Figure 6:
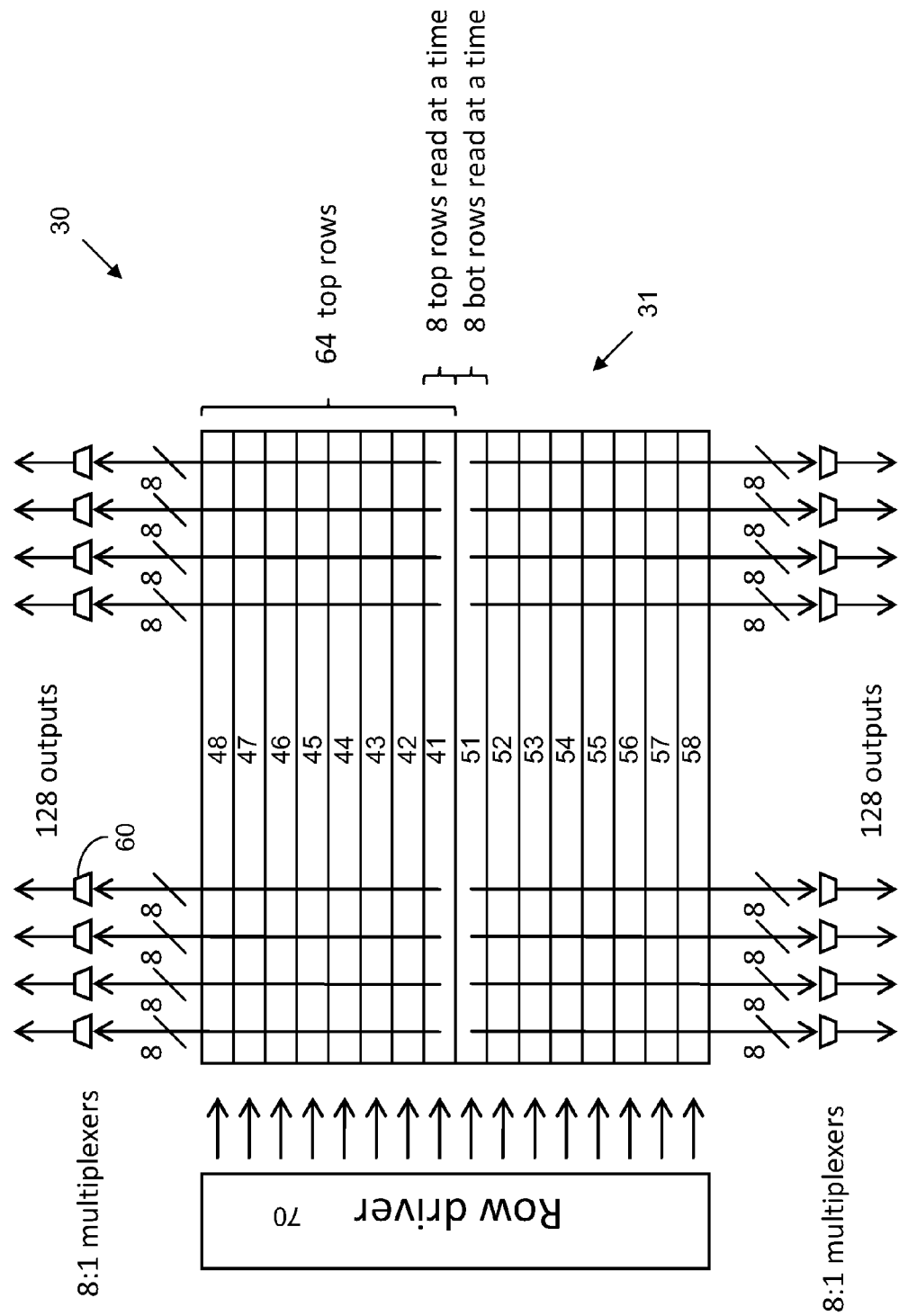
FIG. 6 illustrates an image sensor in accordance with an embodiment of the present invention.

FIG. 6 illustrates an architecture of an image sensor 30 in accordance with an embodiment of the present invention. The image sensor 30 includes a pixel array 31 and a row driver 70 that controls operations of the pixel array 31. The pixel array 31 includes pixels arranged in rows and columns. In the illustration of FIG. 6, blocks of rows of pixels are shown, where each block of rows includes eight rows of pixels. The blocks of rows are shown as blocks 41, 42, 43, 44, 45, 46, 47, 48, 51, 52, 53, 54, 55, 56, 57, 58. The pixel array 31 is split in half for readout, such that signals from the rows in the top half are read out to the top of the pixel array 31 and signals from rows in the bottom half are read out to the bottom of the pixel array 31.

There are eight read out busses for each column of pixels in the pixel array 31. Each group of eight read out busses is connected to a corresponding multiplexer 60. Within each block of rows in the pixel array 31, there are 8 individual rows. Row 1 in each block of rows connects to the first read out bus for each column, row 2 in each block of rows connects to the second read out bus for each column, and so on up to row 8 in each block of rows that connects to the eighth read out bus for each column. In various embodiments, the pixel array 31 has 128 rows and 128 columns and the image sensor 30 operates at 1 million frames/s, such that the image sensor 30 is a 1 million frames/s 128×128 image sensor.

During readout of the pixel array 31, eight rows of pixels in the top half of the pixel array 31 and eight rows of pixels in the bottom half of the pixel array 31 are read out in parallel. In various embodiments, the row access time is 125 ns and the vertical scan rate is 8 MHz. Each group of eight column busses is multiplexed together with a rato of 8:1, to provide a sensor output. With 128 outputs to the top and 128 outputs to the bottom, there are a total of 256 analog outputs. In various embodiments, there is a 64 MHz output signal rate.

Figure 7:
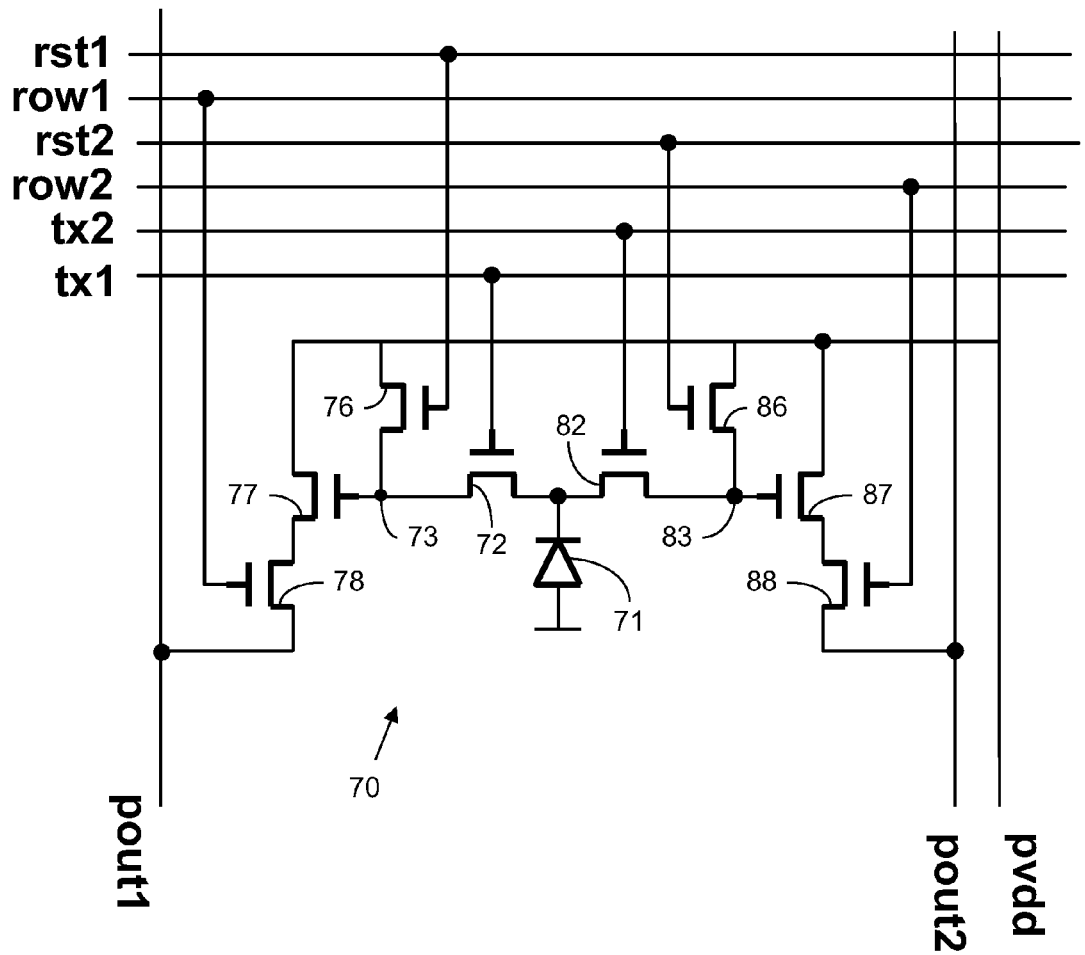
FIG. 7 illustrates a pixel in accordance with an embodiment of the present invention.

FIG. 7 illustrates a pixel 70 that could be used in the pixel array 31 of the image sensor 30 of FIG. 6. With reference to FIG. 7, the pixel 70 includes a photodiode 71, a first transfer gate 72, a first storage diffusion 73, a first reset transistor 76, a first source follower transistor 77, a first row select transistor 78, a second transfer gate 82, a second storage diffusion 83, a second reset transistor 86, a second source follower transistor 87, and a second row select transistor 88. The first storage diffusion 73 can also be called a first storage node 73. The second storage diffusion 83 can also be called a second storage node 83.

The first transfer gate 72 is connected to receive a transfer control signal (tx1), and the first transfer gate 72 is controllable by the transfer control signal tx1 to transfer charge from the photodiode 71 to the first storage diffusion 73. A first terminal of the first reset transistor 76 is connected to Vdd, which is supplied over the line pvdd. A gate of the first reset transistor 76 is connected to receive a reset control signal (rst1). A second terminal of the first reset transistor 76 is connected to the first storage diffusion 73 and to a gate of the first source follower transistor 77. The gate of the first source follower transistor 77 is connected to the first storage diffusion 73 and to the second terminal of the first reset transistor 76. A first terminal of the first source follower transistor 77 is connected to Vdd, which is supplied over the line pvdd. A second terminal of the first source follower transistor 77 is connected to a first terminal of the first row select transistor 78. A gate of the first row select transistor 78 is connected to receive a row select control signal (row1). A second terminal of the first row select transistor 78 is connected to a column readout line pout1 for providing a pixel output signal.

The second transfer gate 82 is connected to receive a transfer control signal (tx2), and the second transfer gate 82 is controllable by the transfer control signal tx2 to transfer charge from the photodiode 71 to the second storage diffusion 83. A first terminal of the second reset transistor 86 is connected to Vdd, which is supplied over the line pvdd. A gate of the second reset transistor 86 is connected to receive a reset control signal (rst2). A second terminal of the second reset transistor 86 is connected to the second storage diffusion 83 and to a gate of the second source follower transistor 87. The gate of the second source follower transistor 87 is connected to the second storage diffusion 83 and to the second terminal of the second reset transistor 86. A first terminal of the second source follower transistor 87 is connected to Vdd, which is supplied over the line pvdd. A second terminal of the second source follower transistor 87 is connected to a first terminal of the second row select transistor 88. A gate of the second row select transistor 88 is connected to receive a row select control signal (row2). A second terminal of the second row select transistor 88 is connected to a column readout line pout2 for providing a pixel output signal. In some embodiments, the second terminal of the first row select transistor 78 and the second terminal of the second row select transistor 88 are connected to a same column readout line rather than to separate column readout lines, which allows for a sharing of the same column readout line. In some such embodiments, for example, pout1 can be shorted to pout2.

The pixel 70 has two transfer gates 72, 82, and two readout circuits, where the first readout circuit includes the transistors 76, 77, and 78, and the second readout circuit includes the transistors 86, 87, and 88. The two transfer gates 72 and 82 operate in alternating mode. While the first transfer gate 72 performs transfer, the second transfer gate 82 is closed, and the stored charge from the photodiode 71 is transferred to the first storage diffusion 73. Then the first transfer gate 72 gets closed giving start to the readout from the first storage diffusion 73, and the second transfer gate 82 gets open and the charge from the photodiode 71 is transferred to the second storage diffusion 83. The signals rst1, row1, rst2, row2, tx2, and tx1 are provided by a row driver, such as the row driver 70 of FIG. 6.

Figure 8:
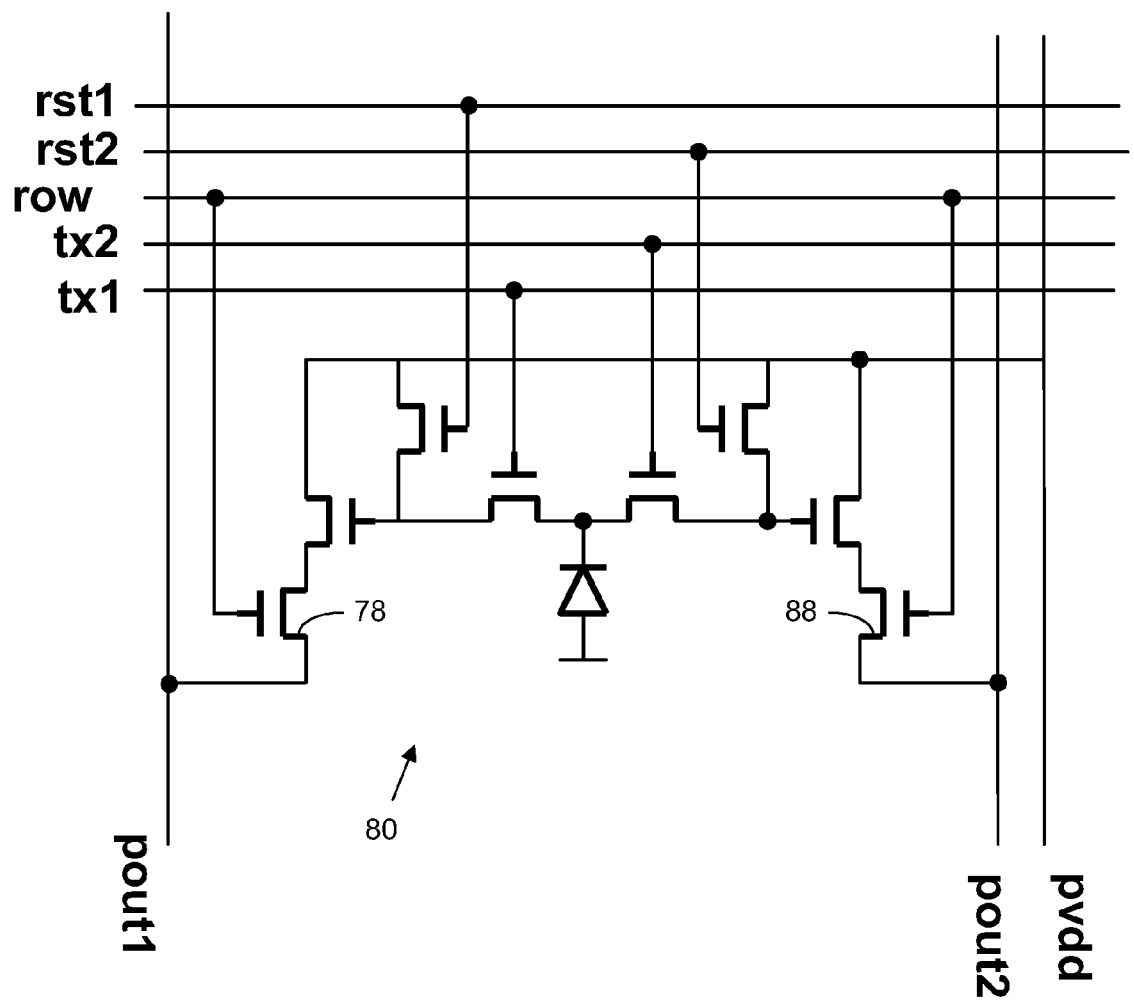
FIG. 8 illustrates a pixel in accordance with an embodiment of the present invention.

The pixel 70 in FIG. 7 is an embodiment of a pixel with dual transfer gates and alternative readout. Each transfer gate has the associated storage diffusion (also called a storage node), a reset transistor controlled by a corresponding reset control signal, a source follower transistor, and row select transistor controlled by a corresponding row select control signal. FIG. 8 illustrates a pixel 80 that is another embodiment of a pixel with dual transfer gates and alternative readout. The difference between the circuits in FIG. 7 and FIG. 8 is that the ROW control signal can be reused for the two readout nodes, which is shown in FIG. 8. Thus, in the pixel 80, the gate of the first row select transistor 78 and the gate of the second row select transistor 88 are both connected to receive a row select control signal (row) over a same row control line. The rest of the circuit of the pixel 80 in FIG. 8 is the same as the circuit of the pixel 70 in FIG. 7.

Figure 1:
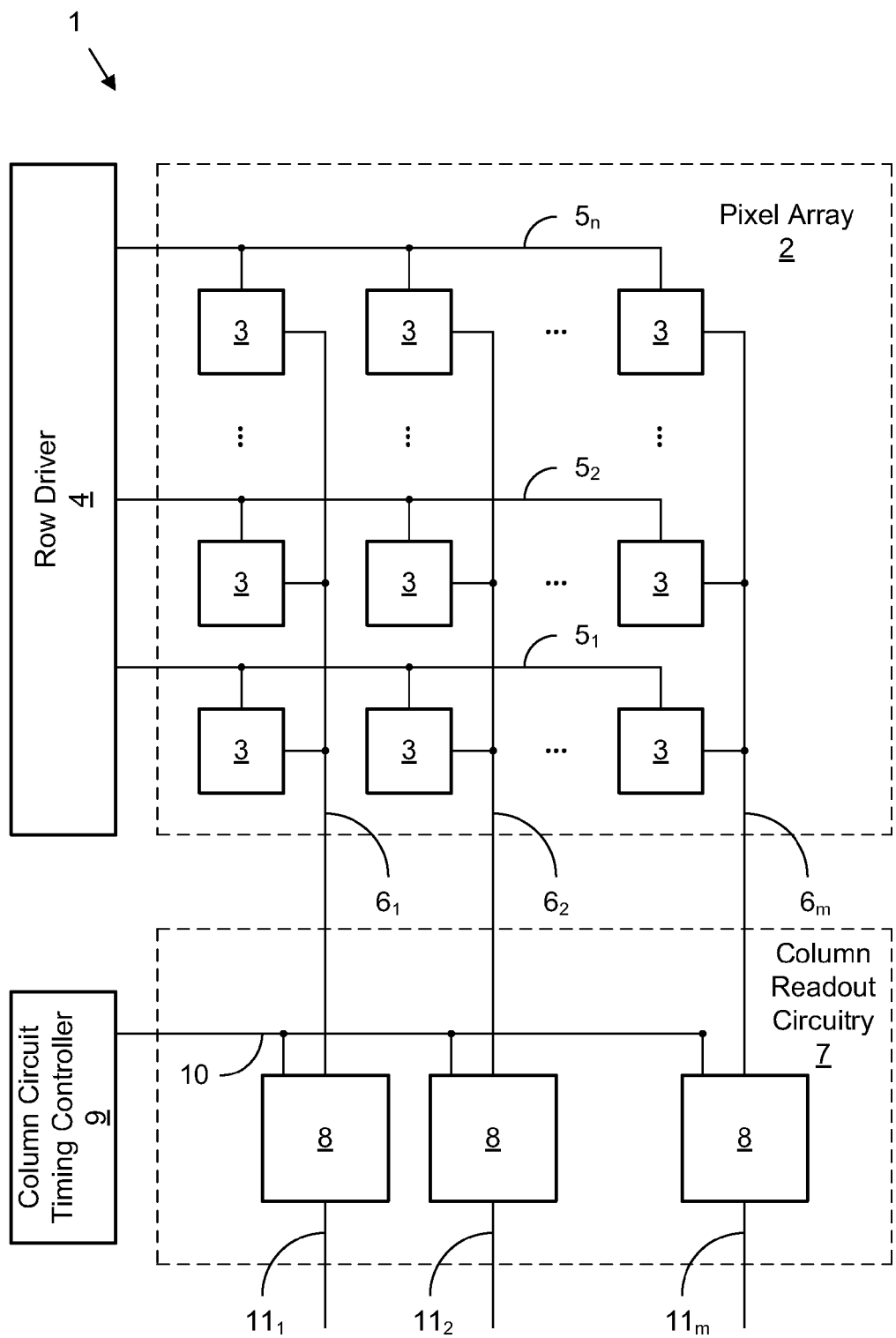
FIG. 1 illustrates an architecture of a related art image sensor.
Figure 2:
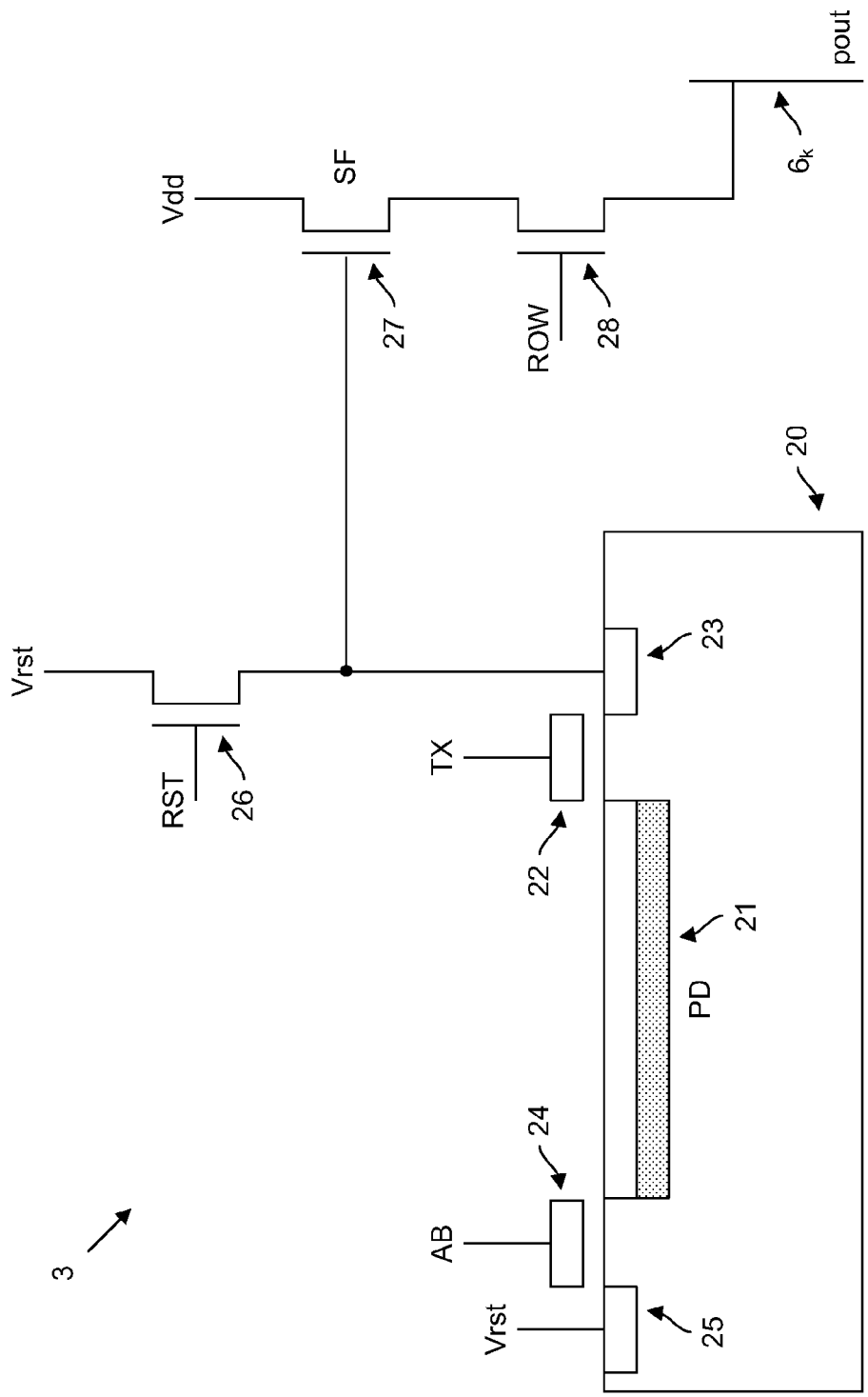
FIG. 2 illustrates an example of a conventional pixel.
Figure 3:
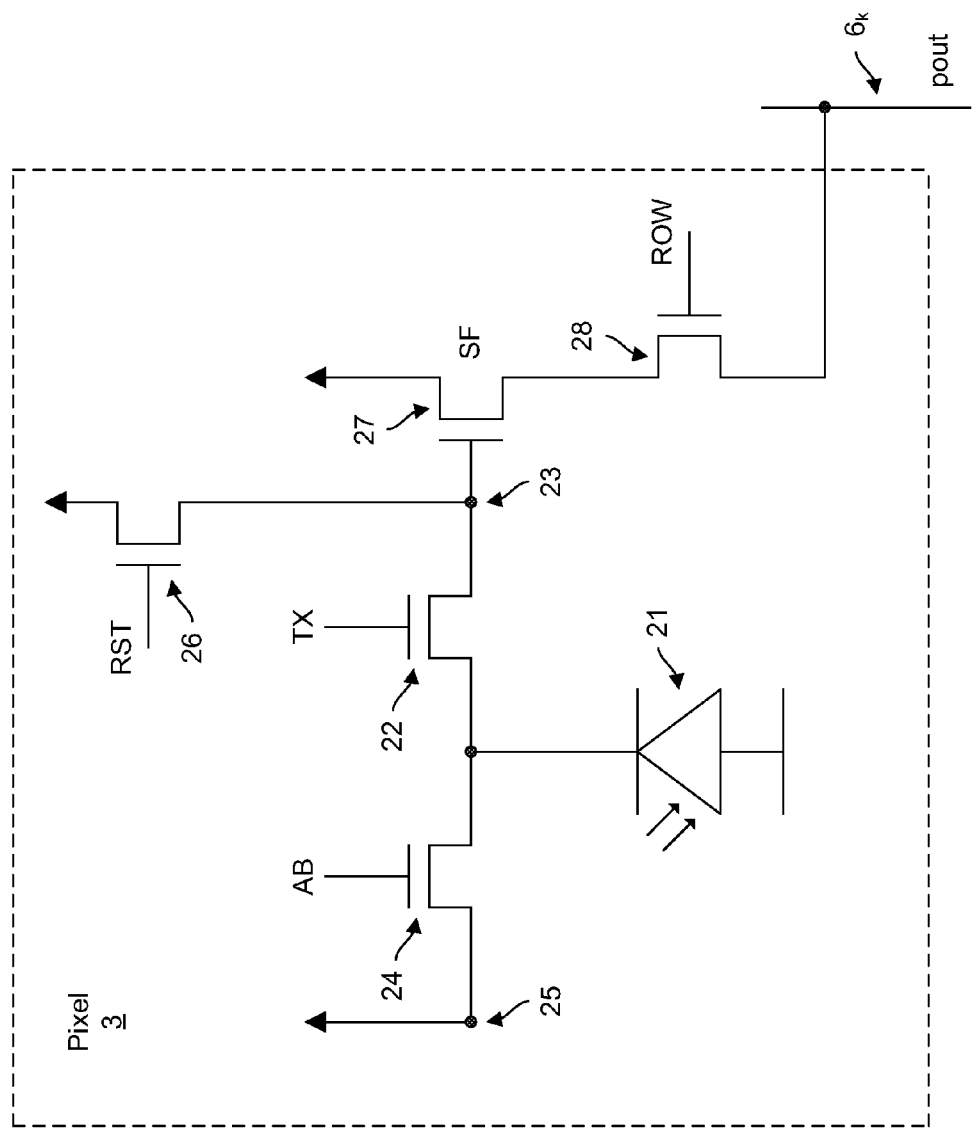
FIG. 3 illustrates a circuit diagram representation of the pixel of FIG. 2.
Figure 4:
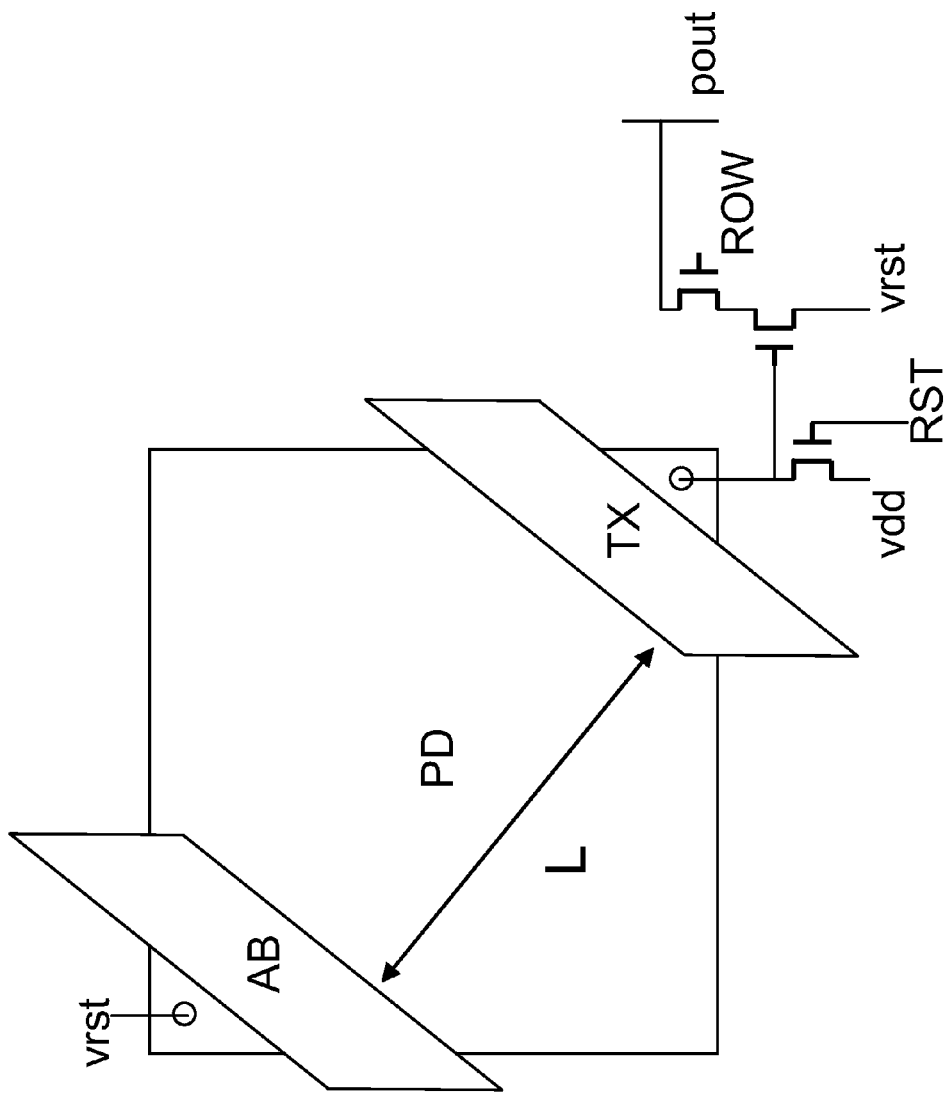
FIG. 4 illustrates a layout of a pixel.
Figure 5:
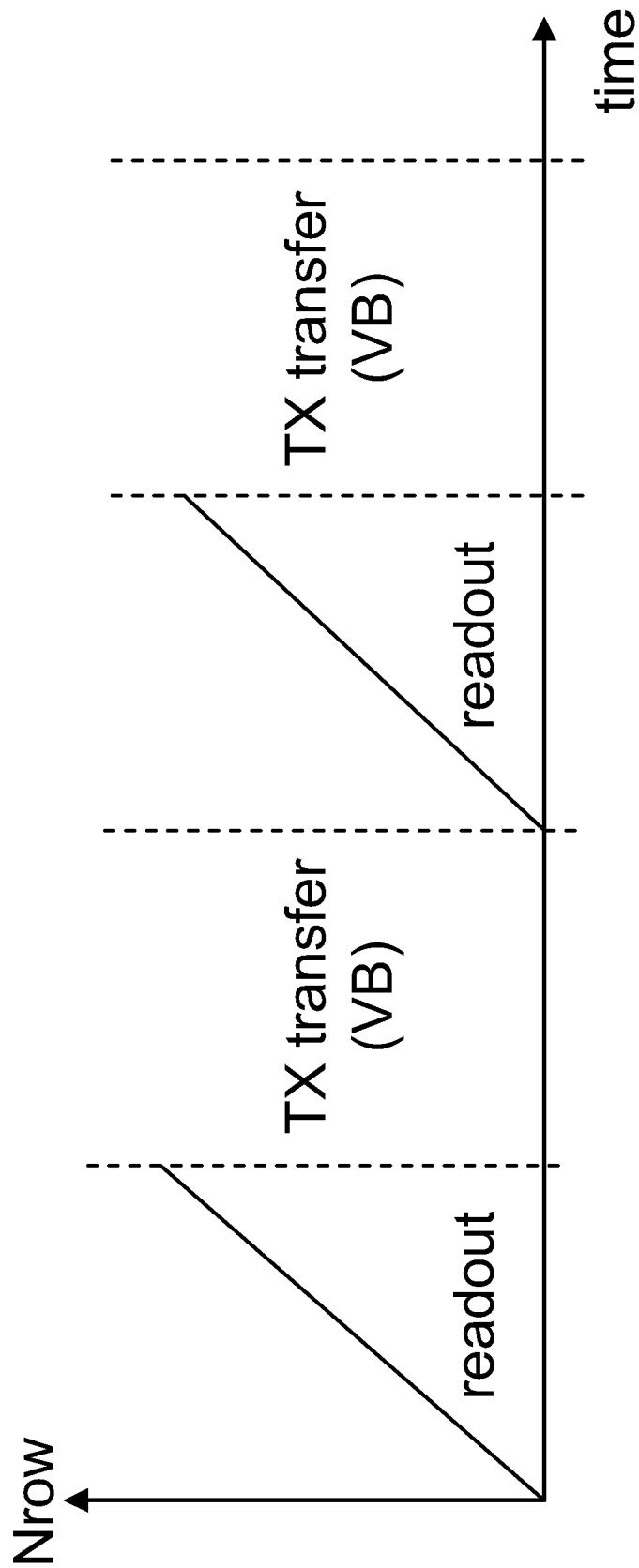
FIG. 5 illustrates a timing diagram for a pixel.
Figure 9:
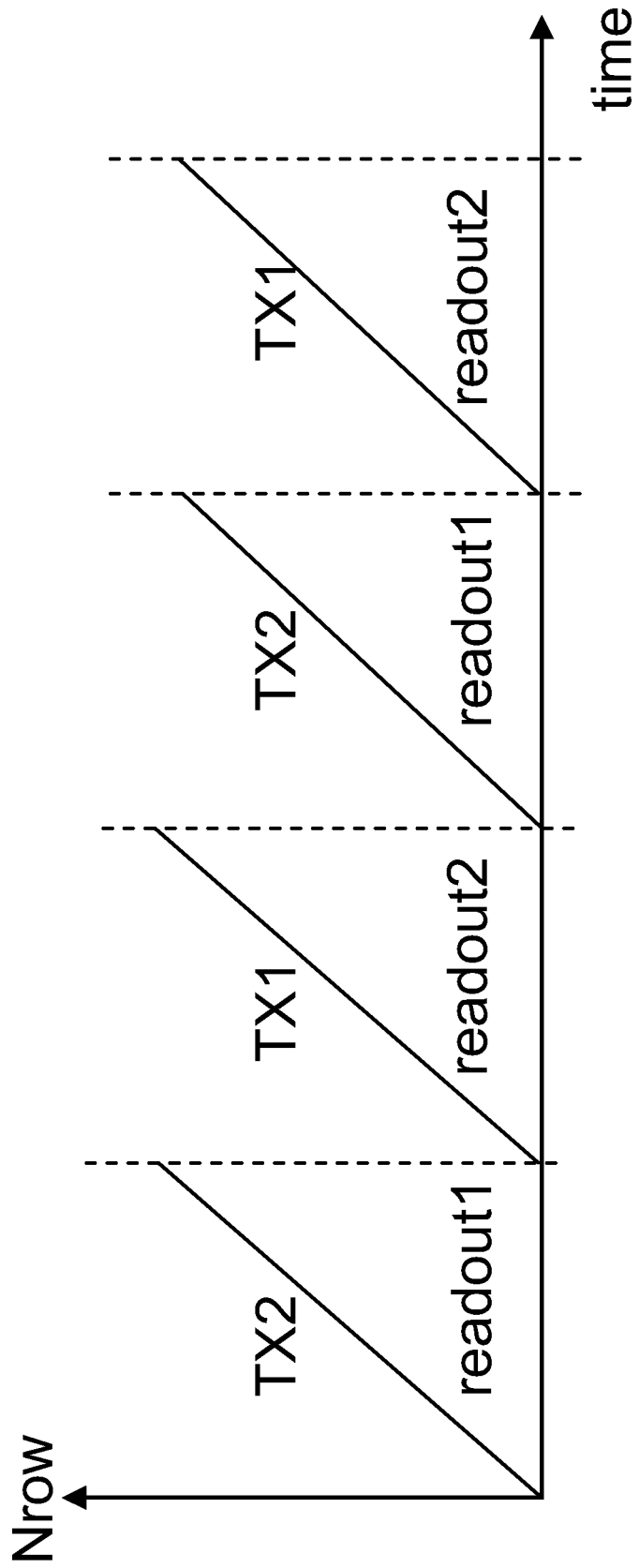
FIG. 9 illustrates a timing diagram for a pixel in accordance with an embodiment of the present invention.

FIG. 9 show a frame timing for a dual-transfer-gate pixel, such as the pixel 70 of FIG. 7 or the pixel 80 of FIG. 8. As shown in FIG. 9, a frame timing of an image sensor with the alternating transfer 2-gate pixel allows for a continuous readout to be implemented without the need for vertical blank. It is instructive to compare the frame timing of FIG. 9 for the dual-transfer-gate pixel with the frame timing of FIG. 5 for the conventional pixel. While in the conventional pixel the transfer time shortens the time allocated to the pixel readout, in the dual-transfer-gate pixel the readout time can reach 100%. This allows a double data rate readout compared to the conventional pixel.

Figure 10:
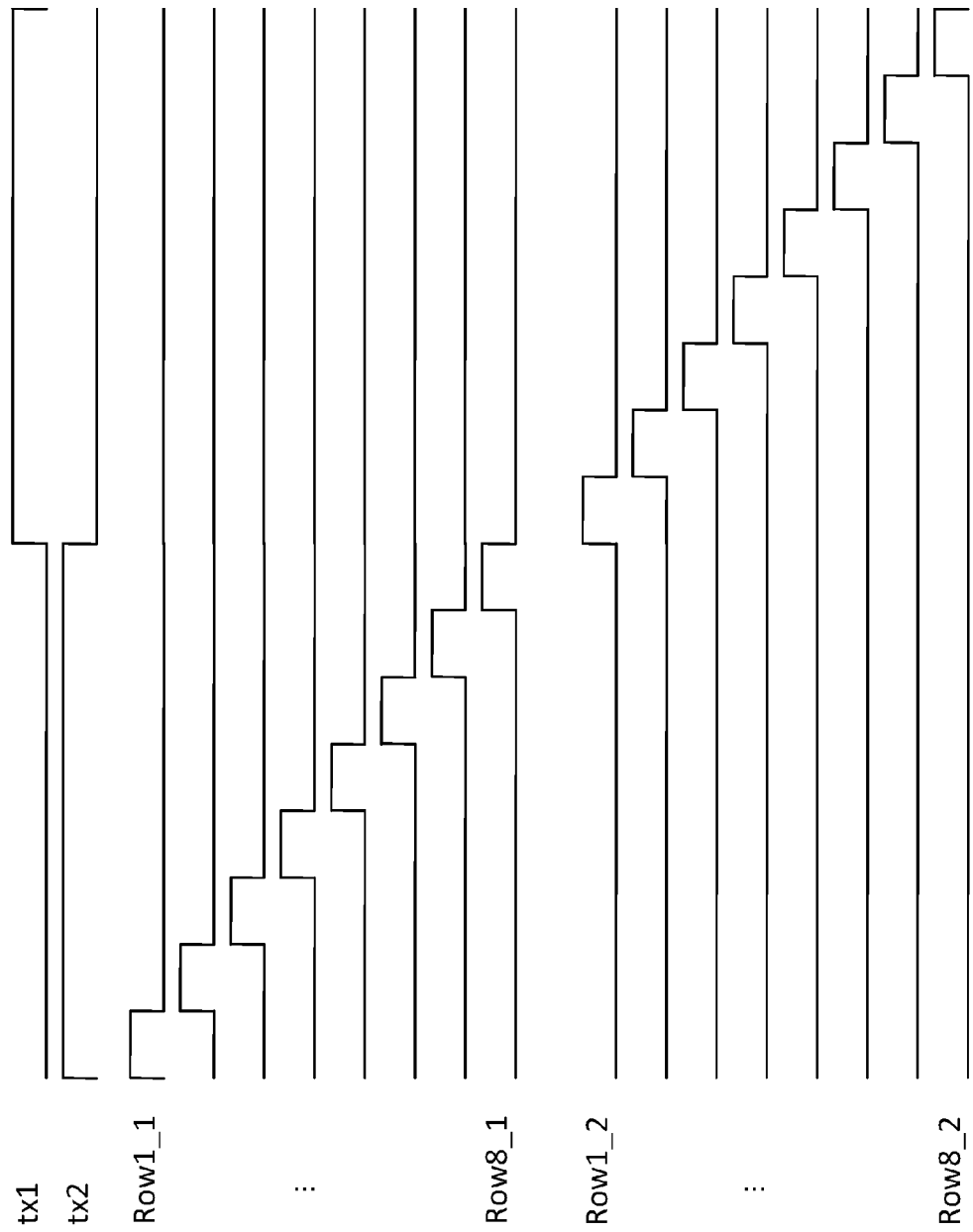
FIG. 10 illustrates a signal timing diagram for pixels in an image sensor in accordance with an embodiment of the present invention.

FIG. 10 illustrates a timing diagram for transfer control signals tx1 and tx2 and row select control signals row1 and row2 for pixels of the type of pixel 70 in FIG. 7 in an image sensor of the type of image sensor 30 of FIG. 6. With reference to FIGS. 6, 7, and 10, the notation "Row1_1" in FIG. 10 refers to a row select control signal for a first block of rows in the pixel array 31 and for a first row select transistor 78 in each pixel 70 in the rows of the first block of rows. Similarly, the notation "Row8_1" in FIG. 10 refers to a row select control signal for an eighth block of rows in the pixel array 31 and for a first row select transistor 78 in each pixel 70 in the rows of the eighth block of rows. The notation "Row1_2" in FIG. 10 refers to a row select control signal for a first block of rows in the pixel array 31 and for a second row select transistor 88 in each pixel 70 in the rows of the first block of rows. Similarly, the notation "Row8_2" in FIG. 10 refers to a row select control signal for an eighth block of rows in the pixel array 31 and for a second row select transistor 88 in each pixel 70 in the rows of the eighth block of rows.

It should also be noted that the functionality of the pixel 70 in FIG. 7 is different from the functionality of the pixel in the Berezin patent (U.S. Pat. No. 6,750,485) and the pixel in the Kawahito patent (U.S. Pat. No. 7,436,496), which were mentioned above in the Background section, and the image sensor designs are also different. There is a difference in that the pixel 70 in FIG. 7 is not used for phase detection, whereas Kawahito is concerned with phase detection. The pixel 70 operates without summating from multiple exposures. In the pixel 70, while charge is transferred to a first storage node of a pixel from a photodiode, a second storage node of the pixel is being readout from the pixel array and the image sensor. Moreover, in an image sensor in accordance with an embodiment with pixels such as the pixel 70, while all first storage nodes in all pixels collect the charge from a corresponding photodiode by enabling a first transfer gate using tx1, all second storage nodes in all pixels are being read out. This allows for pipelining at the pixel level in which the photodiode of a pixel is 100% busy because in various embodiments one of the transfer gates is always enabled to read from the photodiode.

To decrease a transfer time in the photodiode, various embodiments of the present invention create a gradient of the electric field inside the pixel, so that both transfer gates are placed on one side of the pixel, and a negative gradient of the electric field is directed towards the gates. The direction of electric field is defined for positive charge, so the gradient needs to be negative for electrons to slide "down".

Figure 11:
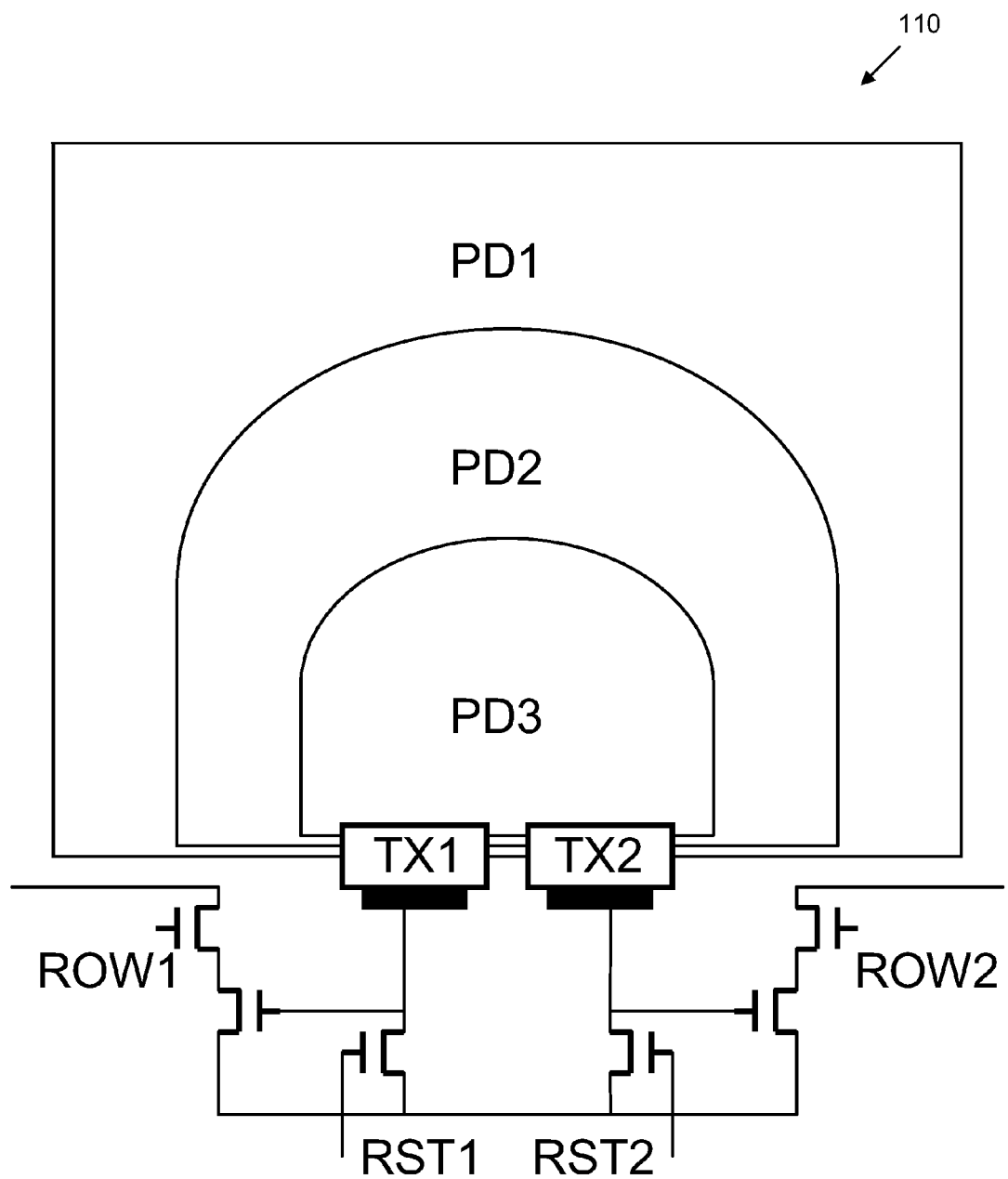
FIG. 11 illustrates a pixel in accordance with an embodiment of the present invention.
Figure 12:
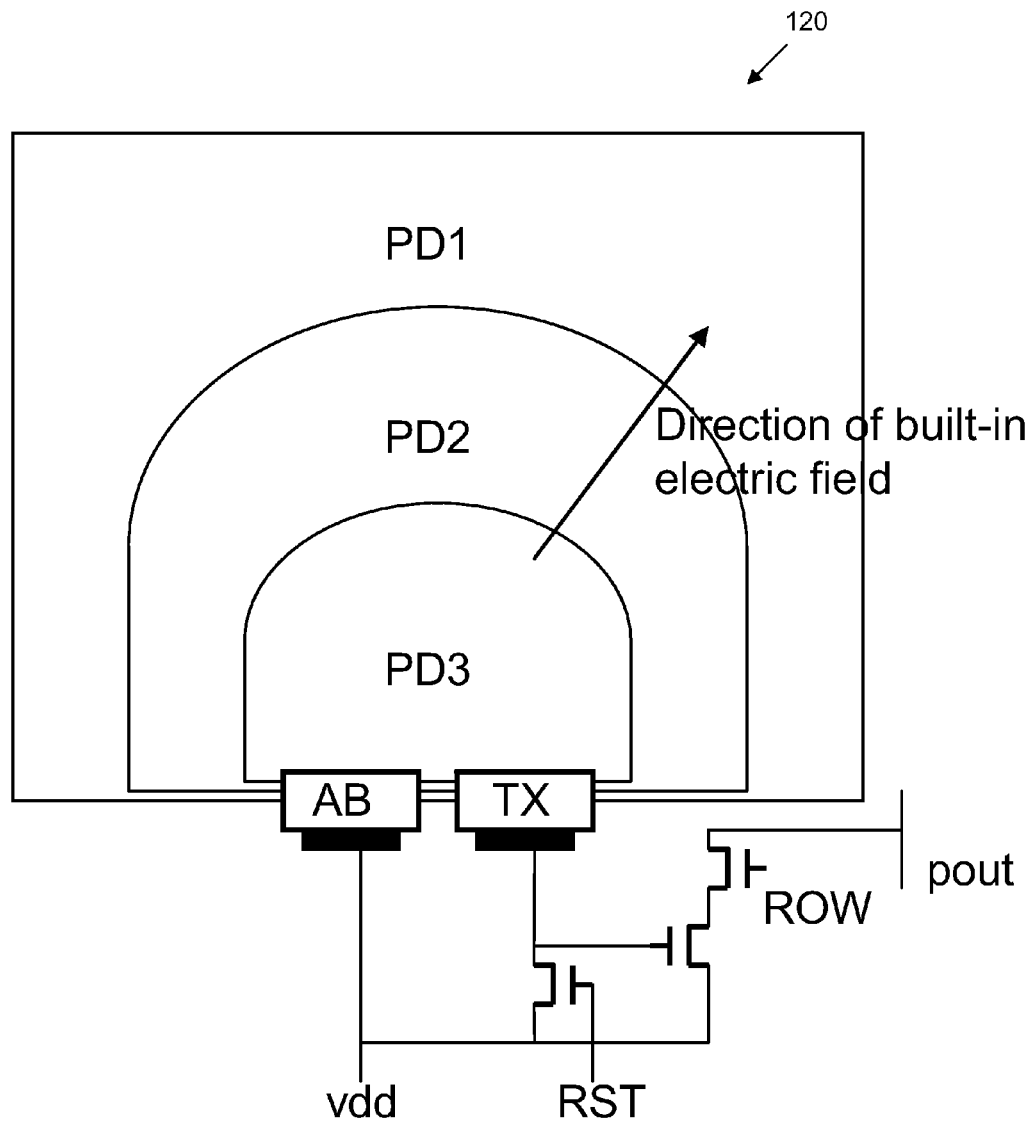
FIG. 12 illustrates a pixel in accordance with an embodiment of the present invention.

FIG. 11 illustrates a pixel 110 in accordance with an embodiment with two transfer gates TX1 and TX2, and the pixel 110 has a built-in electric field. FIG. 12 illustrates a pixel 120 in accordance with an embodiment with a transfer gate TX and an anti-blooming gate AB, and the pixel 120 has a built-in electric field. Thus, a technique for providing a built-in electric field can be applied to a pixel 110 with two transfer gates as well as to a pixel 120 with a transfer gate and an anti-blooming gate, as shown in FIGS. 11 and 12.

In various embodiments, a buried n-implant such as arsenic is done in several steps using several masks. A first dose covers an area (PD1) of the entire photodiode. A second dose covers an area (PD2) closer to the gates. The second implant thus overlaps part of the first implant. A third dose covers a photodiode area (PD3) closest to the gates. As an example, the first implant is AS75 of 135 keV and a dose of $1.5E12$ cm$^{-2}$. The second implant is 135 keV and a dose of $7E13$ cm$^{-2}$. The third implant is the same energy and a dose of $7E13$ cm$^{-2}$. The difference in pinning voltage between these areas may be at least 250-500 mV. Then built in electric field and fringe effects would accelerate the charge transfer in photodiode 10-20 times as compared to the flat pinning voltage case and the transfer through diffusion.

There is another factor which may slow down a pixel response time. It is the diffusion from the bulk of the photodiode to the surface. This transfer can be accelerated by implanting a deep Boron with the energy of 2-5 MeV if one uses an epi-substrate of 4-7 µm as a starting material.

Figure 13:
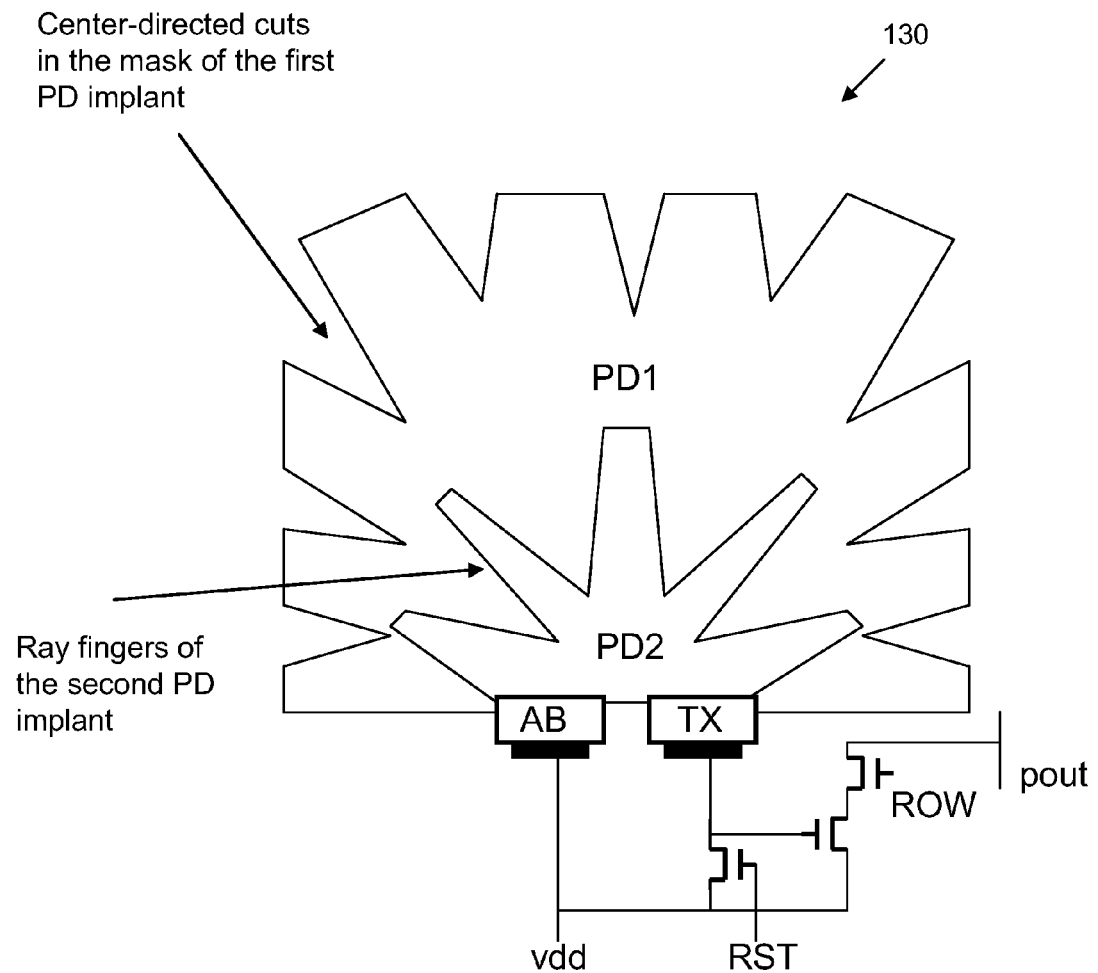
FIG. 13 illustrates a pixel in accordance with an embodiment of the present invention.

In some embodiments, such as in a pixel 130 of FIG. 13, the first mask for the buried n-implant such as arsenic, which covers the larger area (PD1) of the photodiode, is made with triangular or rectangular cuts from the periphery towards the center of the photodiode. The potential in the area of the cuts will be close to zero, so the carriers generated in these areas will be diffusing and drifting to the nearby channels made by the first buried implant. In an analogy to a hydraulic model, this would be similar to water coming down hills. The second buried AS75 implant shown as (PD2) is done on top of the first implant through a mask which has the shape of rays coming up from the location of the transfer gates. The potential in these channels will be higher than in the areas of the first implant, so the carriers will be attracted into these "rivers" flowing towards the gates. This technique creates the field in the photodiode directed towards the transfer direction, so the transfer time is greatly reduced. The approximate dose of the first and the second implant is the same $1.5E12$ cm$^{-2}$. The energy can be 135 keV. The first method of implanting photodiode and the second method of using masks can be combined.

There are other ways to create the built-in electric field in the photodiode. The empty channel potential in the buried channel photodiode depends not only on the dose of the sensor n-implant, but also on the distance between the n-implant and the surface pinning implant which is usually a BF2 implant. While in FIG. 12 the electric field is made with a different dose in the overlapping areas PD1, PD2, and PD3, the alternative way to make the potential difference between the areas PD3, PD3+PD2, and PD1+PD2+PD3 is to use deeper n-implant; so that the implant in PD2 is deeper than PD1, and PD3 is deeper than PD2. For instance, PD2 energy is 145 keV and PD3 energy is 155 keV. Alternatively, the pinning BF2 implant energy in the area PD1 (and not PD2) is higher than in the PD2 area, and, in PD2 area (and not PD1, and not PD3) is higher than in the PD3 area. In one example, the pinning BF2 implant is done as 15 keV $5E+12$ cm$^{-2}$ in the area PD1, then additional BF2 implant of 20 keV $3E12$ cm$^{-2}$ is done in the area defined by Boolean (PD1 and not PD3), and an additional BF2 implant of 25 keV $3E12$ cm$^{-2}$ is done in the area defined by (PD1 and not PD2).

The techniques describes with respect to FIGS. 11, 12, and 13 can also be used when building a pixel with phase detection capability. For example, the present layout and techniques could be used in place of the layout in U.S. Pat. No. 6,750,485.

The embodiments disclosed herein are to be considered in all respects as illustrative, and not restrictive of the invention. For example, two storages could be used in a seven transistor (7T) pixel rather than a 5T pixel, and there could be one readout circuit shared by the two storages in the 7T pixel. The present invention is in no way limited to the embodiments described above. Various modifications and changes may be made to the embodiments without departing from the spirit and scope of the invention. Various modifications and changes that come within the meaning and range of equivalency of the claims are intended to be within the scope of the invention.

What is claimed is:

1. An image sensor, comprising:
a pixel array comprising a plurality of rows and a plurality of columns of pixels; and
a plurality of column readout lines for a particular column of the pixel array, the plurality of column readout lines multiplexed together for output;
wherein each column readout line of the plurality of column readout lines for the particular column of the pixel array extends at least partially into an area of the pixel array and is connected to a corresponding one or more pixels in the particular column of the pixel array.

2. The image sensor of claim 1,
wherein the plurality of column readout lines are multiplexed together by a multiplexer.

3. The image sensor of claim 2,
wherein the multiplexer has a single output line.

4. The image sensor of claim 1,
wherein the pixel array is divided in half such that pixels in a top half of the pixel array output signals to a top side of the pixel array and pixels in a bottom half of the pixel array output signals to a bottom side of the pixel array.

5. The image sensor of claim 4,
wherein the plurality of column readout lines are connected to pixels in a top half of the particular column and another plurality of column readout lines are connected to pixels in a bottom half of the particular column.

6. The image sensor of claim 5,
wherein the plurality of column readout lines that are connected to the pixels in the bottom half of the particular column are multiplexed together for output.

7. An image sensor, comprising:
a pixel array comprising a plurality of rows and a plurality of columns of pixels;
a plurality of column readout lines for a particular column of the pixel array, each of the plurality of column readout lines for the particular column of the pixel array extending at least partially into an area of the pixel array to connect to a corresponding one or more pixels in the particular column of the pixel array; and
a multiplexer connected to the plurality of column readout lines.

8. The image sensor of claim 7,
wherein the multiplexer has a single output line.

9. The image sensor of claim 7,
wherein the plurality of column readout lines are connected as input lines to the multiplexer, and the multiplexer reduces the number of lines for output as compared with the number of input lines.

10. An image sensor, comprising:
a pixel array comprising a plurality of rows and a plurality of columns of pixels; and
a plurality of multiplexers, each multiplexer connected to a corresponding plurality of column readout lines for a corresponding column of the pixel array;
wherein each column readout line of a particular plurality of column readout lines for a particular column of the pixel array extends at least partially into an area of the pixel array and is connected to a corresponding one or more pixels in the particular column of the pixel array.

11. The image sensor of claim 10,
wherein the number of output lines from the plurality of multiplexers is less than the number of column readout lines connected as inputs to the plurality of multiplexers.

12. The image sensor of claim 10,
wherein each of the plurality of multiplexers is connected to provide output on a corresponding single output line.

13. An image sensor, comprising:
a pixel array comprising a plurality of rows and a plurality of columns of pixels;
a plurality of column readout lines for a particular column of the pixel array, each column readout line of the plurality of column readout lines for the particular column of the pixel array extending at least partially into an area of the pixel array and connected to a corresponding one or more pixels in the particular column of the pixel array; and
means for multiplexing together the plurality of column readout lines for output.

14. A method, comprising:
collecting charge in a plurality of pixels located in a particular column of a pixel array, each of the plurality of pixels connected within an area of the pixel array to provide output to a corresponding column readout line of a plurality of column readout lines for the particular column of the pixel array; and
multiplexing signals output on the plurality of column readout lines for the particular column of the pixel array.

15. The method of claim 14,
wherein the plurality of pixels are located in a top half of the pixel array and the signals are output from the plurality of pixels to a top side of the pixel array.

16. The method of claim 14,
said multiplexing comprising multiplexing the signals output on the plurality of column readout lines in such a way so as to provide the signals on a single output line.

17. A method, comprising:
collecting charge in a plurality of pixels located in a particular column of a pixel array;
providing an output from one of the plurality of pixels located in the particular column over a column readout line and then over an output line; and
providing an output from another one of the plurality of pixels located in the particular column over another column readout line separate from the column readout line and then over the output line;
wherein said one of the plurality of pixels is connected to the column readout line within an area of the pixel array, and said another one of the plurality of pixels is connected to the another column readout line within the area of the pixel array.

18. The method of claim 17,
wherein outputs from the plurality of pixels are multiplexed onto the output line.

19. The method of claim 17,
wherein the output from said one of the plurality of pixels is provided over the column readout line before the output from said another one of the plurality of pixels is provided over said another column readout line.

20. The method of claim 17, wherein said column readout line and said another column readout line are connected as inputs to a multiplexer and the output line is connected as an output of the multiplexer.

* * * * *